US009520739B2

(12) United States Patent
Endo et al.

(10) Patent No.: US 9,520,739 B2
(45) Date of Patent: Dec. 13, 2016

(54) WIRELESS CHARGING CIRCUIT, WIRELESS CHARGING SYSTEM AND SEMICONDUCTOR DEVICE

(71) Applicant: Renesas Electronics Corporation, Kawasaki-shi, Kanagawa (JP)

(72) Inventors: Takefumi Endo, Kawasaki (JP); Masanori Kayama, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/692,093

(22) Filed: Apr. 21, 2015

(65) Prior Publication Data

US 2015/0229158 A1 Aug. 13, 2015

Related U.S. Application Data

(63) Continuation of application No. 13/782,009, filed on Mar. 1, 2013, now Pat. No. 9,035,603.

(30) Foreign Application Priority Data

Mar. 12, 2012 (JP) ................................. 2012-054509

(51) Int. Cl.
*H02J 7/00* (2006.01)
*H02J 7/02* (2016.01)
(Continued)

(52) U.S. Cl.
CPC ........... *H02J 7/025* (2013.01); *G01R 19/0084* (2013.01); *H02J 5/005* (2013.01); *H04B 5/0037* (2013.01); *H04B 5/0081* (2013.01); *Y02B 60/50* (2013.01)

(58) Field of Classification Search
CPC .......... H02J 7/025; H02J 5/005; H02J 5/0037; Y02B 60/50; G01R 19/0084; H04B 5/0037; H04B 5/0081
(Continued)

(56) References Cited

U.S. PATENT DOCUMENTS 6,340,852 B1 * 1/2002 Mizoguchi ................ G05F 1/56
307/125
7,920,396 B2 4/2011 Knight
(Continued)

FOREIGN PATENT DOCUMENTS

CN 101436831 A 5/2009
CN 102292896 A 12/2011
(Continued)

*Primary Examiner* — Nathaniel Pelton
(74) *Attorney, Agent, or Firm* — Foley & Lardner LLP

(57) ABSTRACT

To satisfy the NFC communication standard in wireless charging with a shared antenna, used for NFC communication. A power supply unit includes a voltage step-down circuit 331, a charge control circuit 332, and a communication controller power supply circuit 333. The voltage step-down circuit includes a switching regulator 200, and a selection circuit 206 and 208 which can select an output path PT1 of the switching regulator and a bypass path PT2 of the switching regulator. The voltage step-down circuit includes a selection control circuit 207. The selection control circuit supplies voltage to the communication controller power supply circuit via the bypass path at the time of activating the communication controller. Since the output voltage of the series regulator stabilizes in a shorter time than the switching regulator, it becomes possible to keep the time from when RF power rises to when initial communication becomes possible, within standards.

5 Claims, 5 Drawing Sheets

(51) Int. Cl.
  *H04B 5/00*     (2006.01)
  *H02J 5/00*     (2016.01)
  *G01R 19/00*    (2006.01)

(58) Field of Classification Search
  USPC ........................................................ 320/108
  See application file for complete search history.

(56) References Cited

U.S. PATENT DOCUMENTS

| | | |
|---|---|---|
| 8,497,658 B2 | 7/2013 | Von Novak et al. |
| 8,552,596 B2 | 10/2013 | Ichikawa et al. |
| 9,054,749 B2 * | 6/2015 | Wilson ................ G06K 7/10217 |
| 2009/0096422 A1 * | 4/2009 | Trattler ................. H02J 7/0052 |
| | | 320/138 |
| 2010/0311327 A1 | 12/2010 | Hamada |
| 2011/0127951 A1 | 6/2011 | Walley et al. |
| 2011/0234157 A1 * | 9/2011 | Knight .............. H02M 3/33592 |
| | | 320/108 |

FOREIGN PATENT DOCUMENTS

| | | |
|---|---|---|
| JP | 2003-141484 A | 5/2003 |
| JP | 2009-253649 A | 10/2009 |

\* cited by examiner

WIRELESS CHARGING CIRCUIT, WIRELESS CHARGING SYSTEM AND SEMICONDUCTOR DEVICE

CROSS-REFERENCE TO RELATED APPLICATION

This application is a continuation of U.S. application Ser. No. 13/782,009, filed Mar. 1, 2013, which claims benefit of priority from the prior Japanese Application No. 2012-054509, filed Mar. 12, 2012; the entire contents of all of which are incorporated herein by reference.

BACKGROUND

The present invention relates to wireless power feeding technology for wirelessly supplying power from the transmission side to the receiving side, and is particularly and preferably applicable to a wireless charging circuit and a wireless charging system, used for charging a battery by wireless power feeding, and a semiconductor device used therefor.

Patent document 1 (Japanese Patent Laid-Open No. 2003-141484) describes a non-contact/contact IC card which can transmit and receive signals via a non-contact interface even if sufficient power supply is not obtained in a non-contact manner. Particularly, paragraph 0016 of the Patent Document 1 describes a configuration for performing power feeding and communication in a non-contact manner.

In addition, NFC (Near Field Communication) can be exemplified as non-contact communication technology. NFC, an international standard of low power wireless communication technology for a distance of about ten centimeters, is being incorporated in small mobile terminals such as smart phones. In contrast, a technique referred to as wireless charging capable of non-contact (also referred to as "wireless") power supply is being on the rise, and a group named WPC (Wireless Power Consortium) has entered the market with expectation of promoting the contactless charging standard (Qi).

Patent Document 2 (Japanese Patent Laid-Open No. 2009-253649) describes, a technique of controlling the operation of an information transmission means of performing wireless information transmission and a power transmission means of performing non-contact power transmission, between communication devices having the information transmission means and the power transmission means.

SUMMARY 13.56 MHz is used as the carrier frequency in NFC, and the range of 100 to 200 kHz is used as the carrier frequency for wireless charging which is the mainstream of the electromagnetic induction method. Accordingly, NFC and wireless charging of the contactless charging standard respectively require dedicated antennas because they have mutually different carrier frequencies, and thus it becomes difficult to secure locations for installing antennas for small mobile terminals such as smart phones. Therefore, wireless charging with a shared antenna, used for NFC communication is under consideration.

Since the voltage supplied in a wireless manner is as high as 100 to 200 V at the antenna end, and is still as high as several dozen volts even after passing through a matching circuit or a rectifier circuit, a loss equivalent to the voltage difference may occur within the IC (Integrated Circuit) when attempting to charge a single cell of battery (4 to 4.2 V) upon receiving the voltage. As a measure to solve the above-mentioned problem, it is conceivable to provide a switching regulator (DC-DC converter) which converts a direct voltage into another direct voltage. That is, the switching regulator lowers the voltage, to input an appropriate voltage to the charge control circuit. Since there is less power loss with the switching regulator, loss in the IC can be reduced.

In wireless charging, initial communication is required for exchanging information before charging such as whether or not the target of charging is an authenticated device, or information about link status or about required power for charging. Since the initial communication is the wireless charging with a shared antenna, used for NFC communication, it is natural to perform the communication on the basis of the protocol of NFC communication. According to the NFC communication standard on this occasion, it is required to keep the time from when RF (Radio Frequency) power rises to when the initial communication becomes possible, for example, 5 ms or less.

However, it takes a while for the switching regulator to stabilize the output voltage, and thus letting the switching regulator perform power supply to the microcomputer for controlling NFC communication makes it extremely difficult to achieve the requirement of keeping the time from when RF power rises to when the communication becomes possible, 5 ms or less.

The other purposes and the new feature of the present invention will become clear from the description of the present specification and the accompanying drawings.

The following explains briefly the outline of a typical invention among the inventions disclosed in the present application.

That is, a wireless charging circuit includes a coil antenna, a communication controller, a rectifier circuit, and a power supply unit, the power supply unit including a voltage step-down circuit, a charge control circuit, and a communication controller power supply circuit. The voltage step-down circuit includes a switching regulator which can reduce the voltage output from the rectifier circuit, and a selection circuit which can select an output path of the switching regulator and a bypass path for bypassing the switching regulator. Furthermore, the voltage step-down circuit includes a selection control circuit. The selection control circuit causes the selection circuit to select the bypass path at the time of activating the communication controller, to thereby supply voltage to the communication controller power supply circuit via the bypass path. Then, the selection control circuit then causes the selection circuit to select an output path of the switching regulator after the output voltage of the switching regulator has reached a predetermined level, to thereby supply the output of the switching regulator to the communication controller power supply circuit.

The following explains briefly the effect acquired by the typical invention among the inventions disclosed in the present application.

That is, a technique for satisfying the NFC communication standard can be provided in wireless charging with a shared antenna, used for NFC communication.

DETAILED DESCRIPTION

1. Outline of Embodiments

Figure 1:
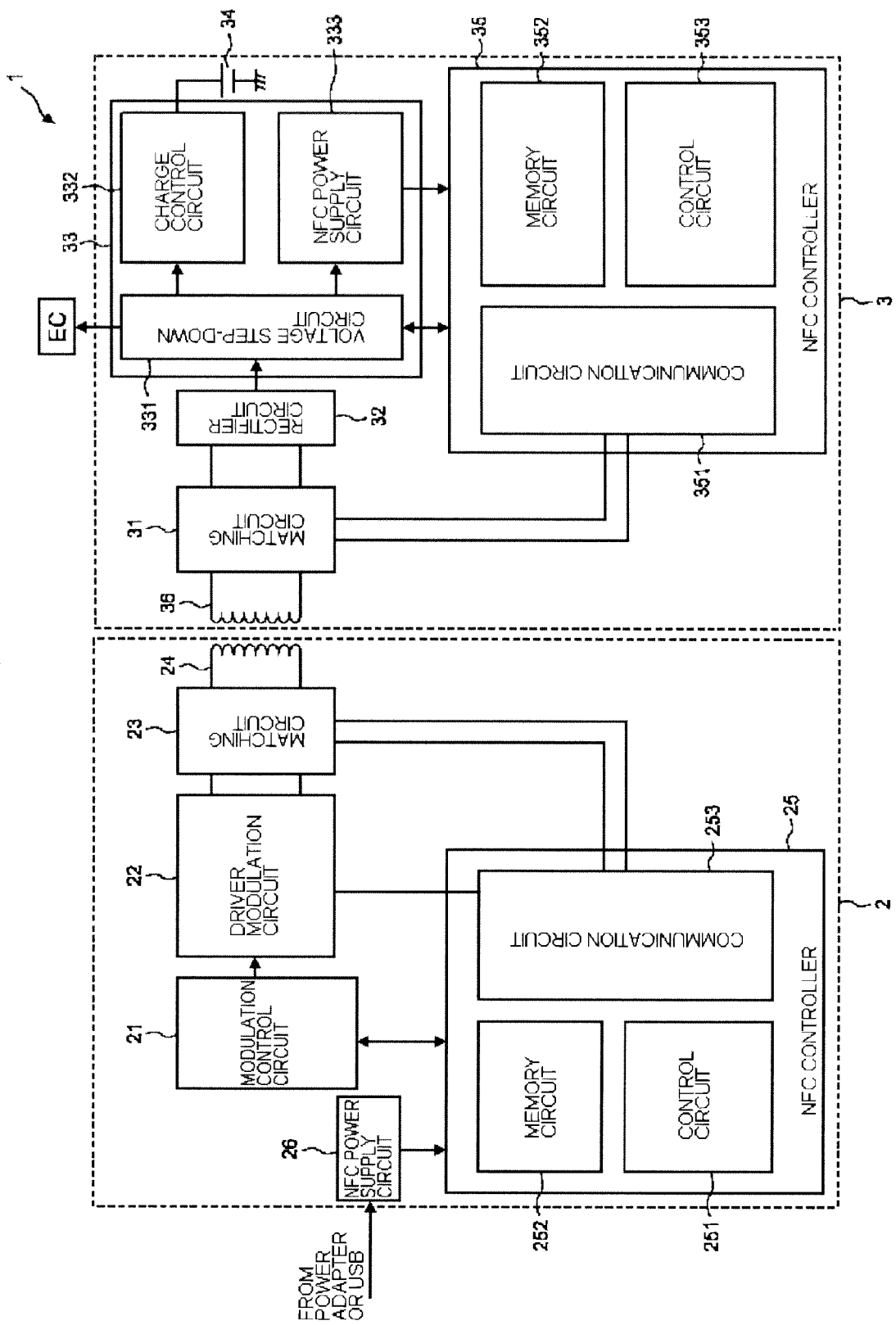
FIG. 1 is an exemplary block diagram showing an overall configuration of a wireless charging system.

The following explains briefly the outline of typical embodiments disclosed in the present application.

Reference numerals in the drawings, parenthesized in the outlined explanation of the representative embodiments, only exemplify what is included in the concept of components to which they are provided.

[1] A wireless charging circuit (3) according to a representative embodiment includes a coil antenna (36), a communication controller (35) which can control short distance wireless communication performed via the coil antenna, a rectifier circuit (32) for rectifying alternating-current signals obtained via the coil antenna, and a power supply unit (33) coupled to the rectifier circuit.

The power supply unit includes a voltage step-down circuit (331) for reducing the output of the rectifier circuit, a charge control circuit (332) for charging a battery by using the output of the voltage step-down circuit, and a communication controller power supply unit (333) for forming an operational power supply voltage of the communication controller on the basis of the output of the voltage step-down circuit.

The voltage step-down circuit includes a switching regulator (200) which can reduce the voltage output from the rectifier circuit, and a selection circuit (206 and 208) which can select between an output path or a first path (PT1) of the switching regulator and a bypass path or a second path (PT2) for bypassing the switching regulator. That is, the output path or the first path (PT1) is used as a path for supplying the output voltage of the switching regulator to a communication controller power supply circuit (333). In contrast, the bypass path or the second path (PT2) is used as a path for supplying the output voltage of the rectifier circuit (32) to the communication controller power supply circuit (333) without passing through the switching regulator (200), and is used as a different path from the output path or the first path.

In other words, the output path or the first path (PT1) is a path for coupling the output of the switching regulator to the input of the communication controller power supply circuit (333). The bypass path or the second path (PT2) is a path for coupling the output of the rectifier circuit (32) to the input of the communication controller power supply circuit (333). The bypass path or the second path (PT2) can also couple the output of the rectifier circuit (32) to the input of the communication controller power supply circuit (333) directly or indirectly via another regulator which is different from the switching regulator.

In addition, the voltage step-down circuit includes a selection control circuit (207). The selection control circuit supplies voltage to the communication controller power supply circuit via the bypass path by causing the selection circuit to select the bypass path at the time of activating the communication controller. Then, after the output voltage of the switching regulator has reached a predetermined level or has stabilized, the selection control circuit supplies the output of the switching regulator to the communication controller power supply circuit by causing the selection circuit to select an output path of the switching regulator.

Figure 5:
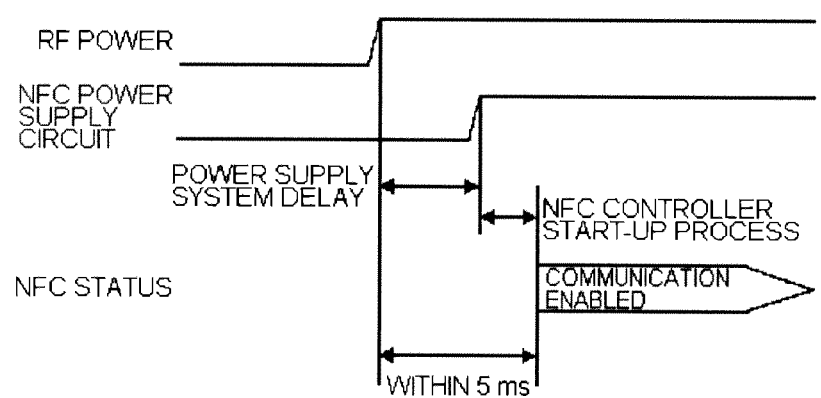
FIG. 5 is a timing diagram from when RF power rises to when initial communication becomes possible.

According to the NFC communication standard, as shown in FIG. 5, for example, the time from when RF power rises to when the initial communication becomes possible has to be kept, for example, 5 ms or less. A switching regulator requires an inductor and a capacitor for obtaining a predetermined direct voltage from the switching output, with the capacitor being charged via the inductor, and thus it takes a long time for the output voltage to stabilize. Accordingly, activation of the communication controller on the basis of the output voltage of the switching regulator makes it difficult to keep the time from when RF power rises to when the initial communication becomes possible, for example, 5 ms or less. In contrast to this, according to the above configuration, the selection circuit selects the bypass path at the time of activating the communication controller, to thereby supply voltage to the communication controller power supply circuit via the bypass path. A switching regulator requires an inductor and a capacitor to obtain a predetermined direct voltage from the switching output, whereas a series regulator is neither provided with an inductor nor a capacitor and thus it takes a shorter time to stabilize the output voltage than the switching regulator. Therefore, selection of the bypass path by the selection circuit at the time of activating the communication controller, to thereby supply voltage to the communication controller power supply circuit via the bypass path makes it possible to achieve the requirement of keeping the time from when RF power rises to when the initial communication becomes possible, for example, 5 ms or less.

Selection of an output path of the switching regulator by the selection circuit after the output voltage of the switching regulator has reached a predetermined level causes the output of the switching regulator to be supplied to the communication controller power supply circuit. Since a switching operation is performed in the switching regulator, a high efficiency can be obtained with a small power loss, and thus the amount of heat generation can be reduced.

[2] In the item [1], the selection circuit can be easily constituted by including a first switch element (208) which can select an output path of the switching regulator by the control of the selection control circuit, and a second selectable switch element (206) which can select the bypass path by the control of the selection control circuit.

Figure 7:
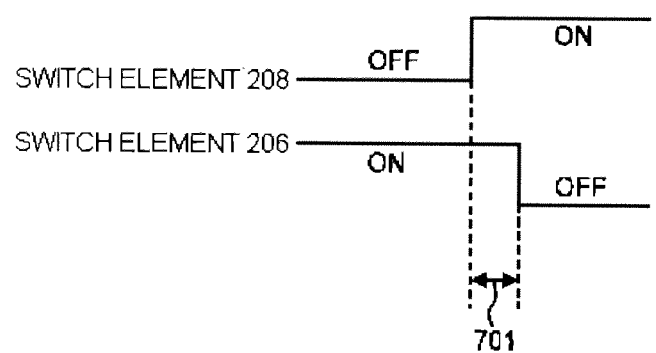
FIG. 7 is an operation timing diagram in the selection control circuit shown in FIG. 6.

[3] After the first switch element has transitioned from an unselected state to a selected state and an output path of the switching regulator has been selected, the selection control circuit controls the second switch element to be in the unselected state. Overlapping of the OFF periods of the first switch element and the second switch element may cause power supply noise due to instantaneous interruption of the voltage being supplied. Therefore, the selection control circuit performs control so that, as shown in FIG. 7, the second switch element (206) is controlled to be in the unselected state (OFF state) after the first switch element (208) has transitioned from the unselected state (OFF state) to the selected state (ON state) and the output path of the switching regulator has been selected. Accordingly, generation of power supply noise can be prevented since no instantaneous interruption of voltage occurs.

[4] In the item [3], the communication controller can include a microcomputer.

[5] In the item [4], a series regulator (205) can be arranged between the rectifier circuit and the second switch element. The series regulator reduces the output voltage of the rectifier circuit to a predetermined level and outputs it, in a shorter time than the time required from when the output voltage of the rectifier circuit is supplied to the switching regulator to when the output voltage of the switching regulator stabilizes. Since providing such a series regulator allows the voltage reduced by the series regulator to be supplied to the communication controller power supply circuit, it is expected that the load is mitigated when further reducing the voltage in the communication controller power supply circuit.

[6] In the item [4], the second switch element can be formed so as to select the output of the rectifier circuit. In this case, it is expected that voltage step-down circuit can be simplified since the series regulator or the like is not arranged between the rectifier circuit and the second switch element.

[7] A wireless charging system can be formed by including a power transmitting-side device, and a power receiving-side device which can receive power from a power transmitting-side device in the non-contact state. In this case, the power receiving-side device can be constituted in a manner similar to the wireless charging circuit described in the items [1] to [6].

2. Details of Embodiments

The embodiments will be described below in more detail.

<<First Embodiment>>

FIG. 1 shows a wireless charging system.

The wireless charging system 1 shown in FIG. 1 includes a power transmitting-side device 2 and a power receiving-side device 3. Short distance wireless communication according to NFC (Near Field Communication) is performed between the power transmitting-side device 2 and the power receiving-side device 3. In addition, it is configured such that power is supplied from the power transmitting-side device 2 to the power receiving-side device 3 in a non-contact manner.

The power transmitting-side device 2 includes a modulation control circuit 21, a driver modulation circuit 22, a matching circuit 23, a coil antenna 24, an NFC controller 25, and an NFC power supply circuit 26. The driver modulation circuit 22 modulates the carrier wave according to the data to be transmitted in the case of NFC communication, whereas it forms an unmodulated signal for power supply in the case of power transmission. The coil antenna 24 is excited by the output of the driver modulation circuit 22. The modulation control circuit 21 controls modulation operation of the driver modulation circuit 22. The matching circuit 23 is coupled in parallel to the coil antenna 24 to forma resonance circuit. The received signal in NFC communication is taken into the NFC controller 25 via the matching circuit 23. The NFC controller 25, which is formed by a microcomputer provided with an NFC communication function, includes a control circuit 251, a memory circuit 252, and a communication circuit 253, although not particularly limited thereto. The control circuit 251, which is formed by CPU, executes a predetermined program for NFC control. The memory circuit 252 includes a ROM (Read Only Memory) and a RAM (Random Access Memory). The ROM has a program executed by the CPU stored therein. The RAM is used for a work area of the processing performed by the CPU. The communication circuit 253 performs short distance wireless communication via the coil antenna 24. An operational power supply of the NFC controller 25 is supplied from an NFC power supply circuit 26. The NFC power supply circuit 26 is supplied with power supply voltage by a power adapter, or a Universal Serial Bus (USB), although not particularly limited thereto.

The power receiving-side device 3 includes the coil antenna 36, a matching circuit 31, the rectifier circuit 32, the power supply unit 33, a battery 34, and an NFC controller 35. The coil antenna 36 generates electromotive force (alternating-current signal) by an alternating magnetic field generated by a coil antenna 23 of the power transmitting-side device 2. The matching network 31 is coupled in parallel to the coil antenna 36 to forma resonance circuit. The rectifying circuit 32 rectifies the alternating-current signal obtained via the coil antenna 36. The power supply unit 33 supplies the operational power supply voltage to an electronic circuit EC which is assumed to be a load circuit of a smart phone or the like, supplies charge voltage to the battery 34, supplies the operational power supply voltage to the NFC controller 35 on the basis of the output voltage of the rectifier circuit 32. The battery 34 is assumed to be a single cell battery (4 to 4.2 V), for example, a lithium ion battery, although not particularly limited thereto. The power supply unit 33 includes the voltage step-down circuit 331, the charge control circuit 332, and the NFC power supply circuit 333. The voltage step-down circuit 331 reduces the output voltage of the rectifier circuit 32. The charge control circuit 332 charges the battery 34 on the basis of the output voltage of the voltage step-down circuit 331. The NFC power supply circuit 333 generates the operational power supply voltage of the NFC controller 35. The received signal in NFC communication is taken into the NFC controller 35 via the matching circuit 31. The NFC controller 35, which is formed with a microcomputer, includes a communication circuit 351, a memory circuit 352, and a control circuit 353, although not particularly limited thereto. The communication circuit 351 performs short distance wireless communication via the coil antenna 36. The control circuit 353, which is formed with a CPU, executes a predetermined program for NFC control. The memory circuit 352 includes a ROM and a RAM. The ROM has a program executed by the CPU stored therein. The RAM is used for a work area of the processing performed by the CPU.

Figure 2:
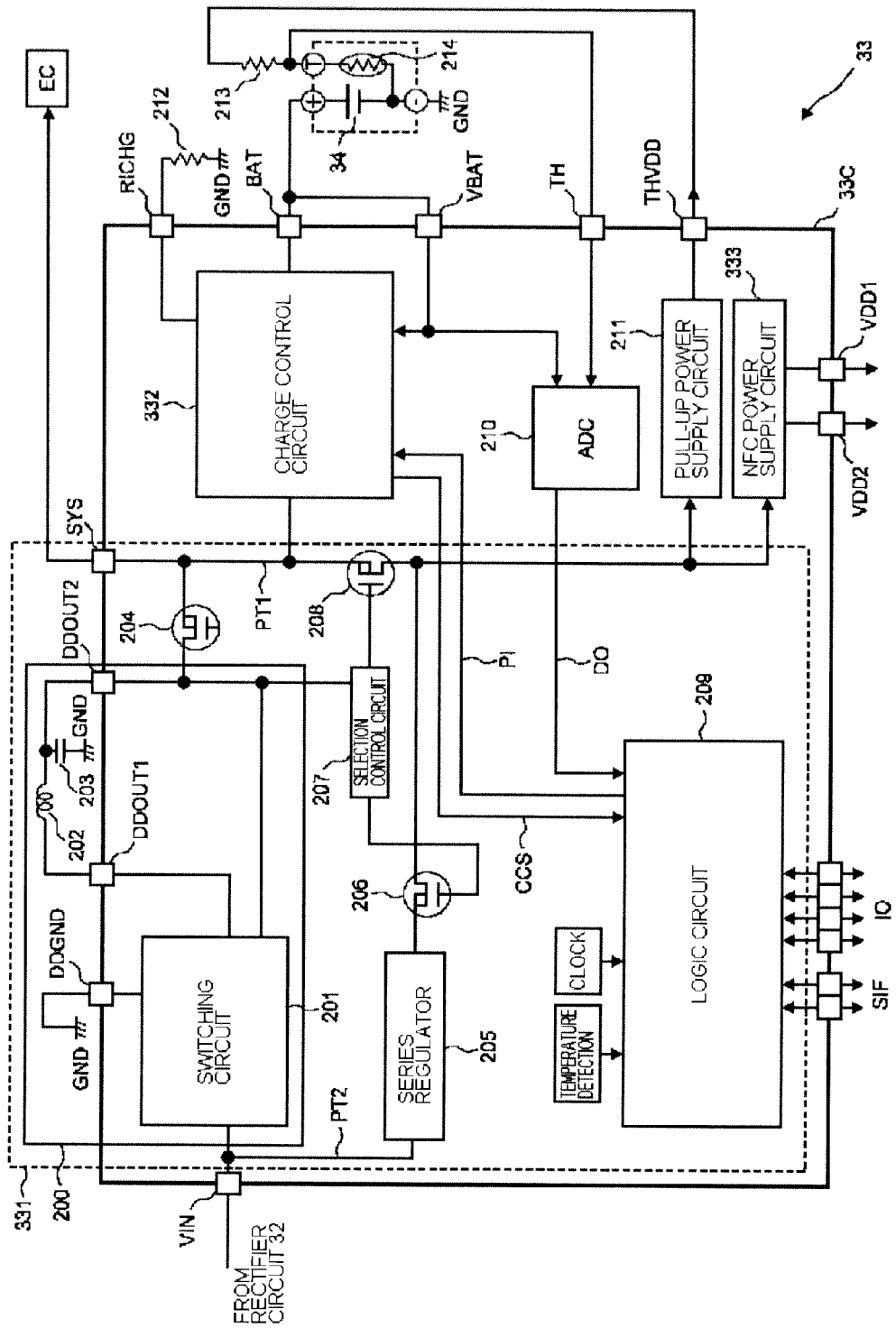
FIG. 2 is an exemplary block diagram showing a power supply unit in the wireless charging system shown in FIG. 1.

FIG. 2 shows an exemplary configuration of the power supply unit 33 in detail. The power supply unit 33 is assumed to be a semiconductor device in the form of a resin package sealed by insulative resin such as mold resin, although not particularly limited thereto.

The main part of the power supply unit 33 shown in FIG. 2, which is formed over a single semiconductor substrate such as a silicon substrate by known semiconductor integrated circuit manufacturing technology, although not particularly limited thereto, will be referred to as a "power supply chip". The power supply chip 33C includes the voltage step-down circuit 331, the charge control circuit 332, an analog-digital converter (abbreviated as "ADC" in the following) 210, a pull-up power supply circuit 211, and the NFC power supply circuit 333.

The power supply chip 33C has provided therein a power supply input terminal VIN, a ground terminal DDGND, output terminals DDOUT1 and DDOUT2, a system power supply output terminal SYS, a charging terminal RICHG, a battery coupling terminal BAT, a battery voltage terminal VBAT, a thermistor coupling terminal TH, and a thermistor power supply terminal THVDD. In addition, the power supply chip 33C has provided therein NFC power supply output terminals VDD1 and VDD2, an input/output terminal IO, and a serial interface terminal SIF. The output voltage of the rectifier circuit 32 is input via the power supply input terminal VIN. The ground terminal DDGND is assumed to be a ground terminal of a switching regulator 200. The output terminals DDOUT1 and DDOUT2 have an inductor 202 and a capacitor 203 externally attached thereto. The system power supply output terminal SYS is coupled to, for example, an electronic circuit such as a smart phone, and thus power is supplied to the electronic circuit via the system power supply output terminal SYS. The charging terminal RICHG has a resistor 212 externally attached thereto. The maximum current value for battery charging is determined by the value of the resistor 212. The battery coupling terminal BAT and the battery voltage terminal VBAT have the positive electrode terminal (+) of the battery 34 coupled thereto. The thermistor coupling terminal TH has the Terminal T of thermistor 214 coupled thereto. The thermistor 214 is arranged in the vicinity of the battery 34 for detecting the temperature of the battery 34. The thermistor power supply terminal THVDD has thermistor 214 coupled thereto via the resistor 213. The operational power supply voltage of the NFC controller 35 is output from the NFC power supply output terminals VDD1 and VDD2. Various control information is allowed to be input and output via the input/output terminal IO or the serial interface terminal SIF. That is, the input/output terminal IO and the serial interface terminal SIF are allowed to be coupled to the NFC controller 35, and used to input and output various control information between the power supply unit 33 and the NFC controller 35.

The voltage step-down circuit 331 reduces the voltage which has been taken in from the rectifier circuit 32 via the power supply input terminal VIN. The output voltage of the voltage step-down circuit 331 is transmitted to the charge control circuit 332, the ADC210, the pull-up power supply circuit 211, and the NFC power supply circuit 333. In addition, the output voltage of the voltage step-down circuit 331 and the output voltage of the battery 34 are allowed to be externally output via the system power supply output terminal SYS.

The charge control circuit 332 charges the battery 34 via the charging terminal RICHG and the battery coupling terminal BAT. In addition, the output voltage of the battery 34 is assumed to be transmittable to the system power supply output terminal SYS via the charge control circuit 332.

The ADC210 takes in the output voltage of the battery 34 via the battery voltage terminal VBAT, and converts it into digital data. In addition, the ADC210 takes in the result of temperature detection by thermistor 214 via thermistor coupling terminal TH, and converts it into digital data. The digital signal output of the ADC210 is transmitted by a logic circuit within the voltage step-down circuit 331.

The pull-up power supply circuit 211 supplies the pull-up power supply voltage to thermistor 214 via thermistor power supply terminal THVDD and the resistor 213.

The NFC power supply circuit 333 generates the operational power supply voltage of the NFC controller 35 on the basis of the output of the voltage step-down circuit 331. The output voltage of the NFC power supply circuit 333 is supplied to the NFC controller 35 via the NFC power supply output terminals VDD1 and VDD2. In this example, it is assumed, in relation with the microcomputer applied to the NFC controller 35, that 3.0 V is output via the NFC power supply output terminal VDD1 and 1.8 V is output via the NFC power supply output terminal VDD2, although not particularly limited thereto.

The voltage step-down circuit 331 includes the switching regulator (DC-DC converter) 200, a current limiting element 204, the switch elements 206 and 208, the series regulator 205, the selection control circuit 207, and a logic circuit 209.

The switching regulator 200, which includes a switching circuit 201, the inductor 202, the capacitor 203, reduces the output voltage of the rectifier circuit 32.

Figure 3:
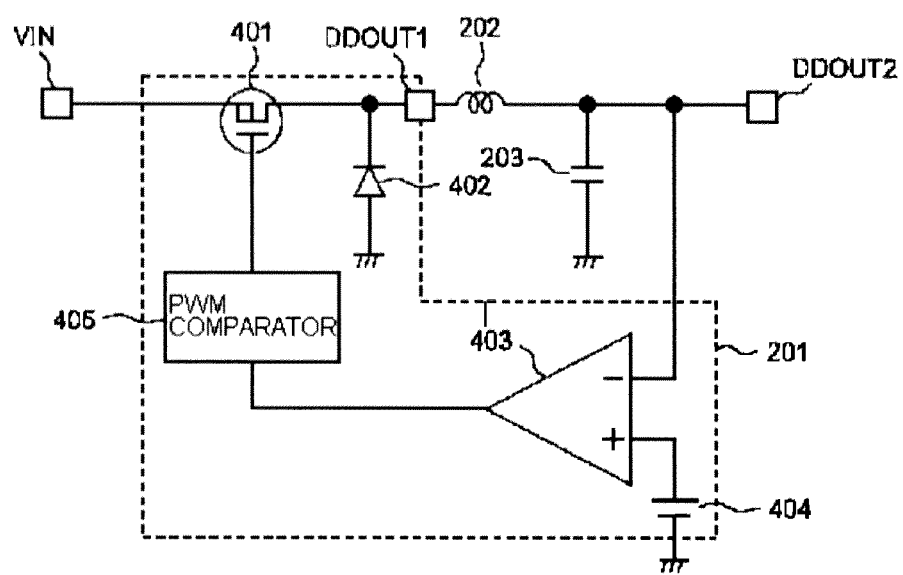
FIG. 3 is an exemplary circuit diagram showing a configuration of a switching regulator.

The switching circuit 201 takes out the required energy by switching from the voltage which has been input via the power supply input terminal VIN. The output of the switching circuit 201 is supplied to the inductor 202 and the capacitor 203, and thus a direct voltage at a predetermined level is formed. The switching circuit 201 can be constituted by including, as shown in FIG. 3 for example, a switch element 401, a diode 402, an error amplifier 403, a reference voltage supply 404, and a PWM (pulse width modulation) comparator 405. The error amplifier 403 amplifies the difference between the reference voltage of the reference voltage supply 404 and the voltage of the output terminal DDOUT2. The output of the error amplifier 403 is transmitted to the PWM comparator 405. The PWM comparator 405 compares the output of the error amplifier 403 with an internally generated sawtooth wave, to thereby form a PWM signal. The switching operation of the switch element 401 is controlled by the formed PWM signal. The diode 402 is provided in order to maintain the current supply to the inductor 202 during the OFF period of the switch element 401. The switch element 401 can have a p-channel MOS transistor applied thereto. In addition, the diode 402 can be replaced with an n-channel MNOS transistor controlled by the PWM comparator.

The current limiting element 204 in FIG. 2 is provided in order to limit the output current of the switching regulator 200 in order to protect the switching regulator 200. The output of the switching regulator 200 is transmitted to the charge control circuit 332 and the system power supply output terminal SYS or the like, via the current limiting element 204. The current limiting element 204 can have a p-channel MOS transistor applied thereto.

The switch element 208 is provided in order to select a path (output path (or first path) of the switching regulator) PT1 through which the output voltage of the switching regulator 200 is transmitted to the NFC power supply circuit 333. The switch element 206 is provided in order to select a bypass path (or second path) PT2 for bypassing the switching regulator 200. That is, the bypass path (or second path) PT2 is assumed to be path for transmitting the output voltage of the rectifier circuit 32 to the NFC power supply circuit 333 via the series regulator 205, without going through the switching regulator 200, and assumed to be a different path from the output path (or first path) PT1. In other words, the output path or first path (PT1) is a path for coupling the output of the switching regulator 200 to the input of the NFC power supply circuit 333. The bypass path (or second path) PT2 is a path for coupling the output of the rectifier circuit 32 to the input of the NFC power supply circuit 333. The bypass path (or second path) PT2 couples the output of the rectifier circuit 32 to the input of the NFC power supply circuit 333, via another regulator (series regulator 205) which is different from the switching regulator 200.

The switch elements 206 and 208 function as a selection circuit which can select the output path PT1 of the switching regulator 200 and the bypass path PT2. The switch elements 206 and 208 can have a p-channel MOS transistor applied thereto.

Figure 6:
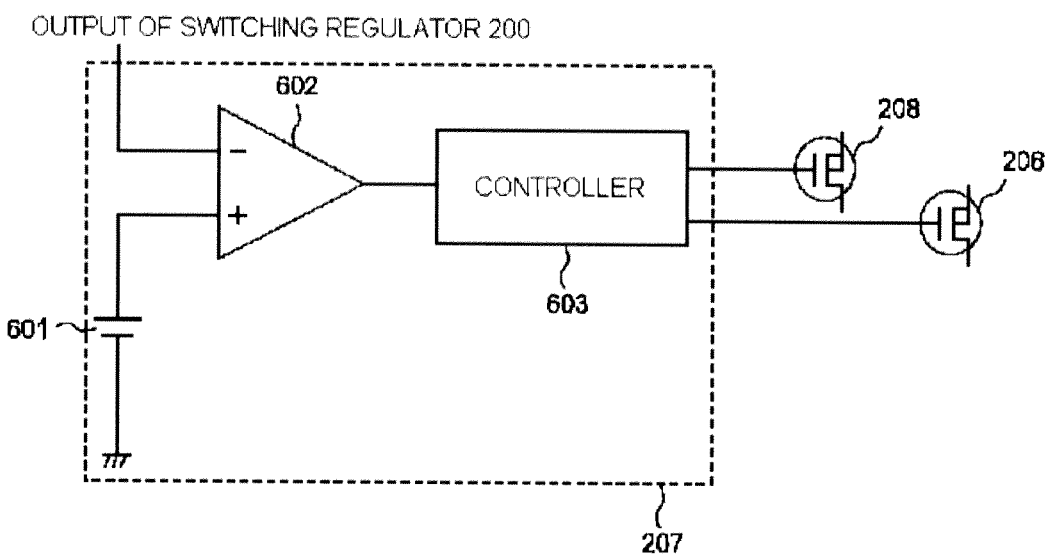
FIG. 6 is an exemplary circuit diagram showing a configuration of a selection control circuit.

The selection operation of the switch elements 206 and 208 is controlled by the selection control circuit 207. The selection control circuit 207 couples the bypass path PT2 to the NFC power supply circuit 333 by causing the switch element 206 to select the bypass path PT2 at the time of activating the NFC controller 35. In addition, after the output voltage of the switching regulator 200 has reached a predetermined level or stabilized, the selection control circuit 207 supplies the output of the switching regulator 200 to the NFC power supply circuit 333 by causing the switch element 208 to select the output path PT1 of the switching regulator 200. The selection control circuit 207, as shown in FIG. 6, is constituted by including a comparator 602 which compares output of the switching regulator 200 with the reference voltage of a reference voltage supply 601, and a controller 603 for controlling the selection operation of the switch elements 206 and 208 on the basis of the result of comparison by the comparator 602. Basically, the switch elements 206 and 208 are switched on and off complementarily by the controller 603. That is, if switching on the switch element 206 causes the output of the series regulator 205 to be supplied to the pull-up power supply circuit 211 and the NFC power supply circuit 333, the switch element 208 is switched off. If, in contrast, switching on the switch element 208 causes the output of the switching regulator 200 to be supplied to the pull-up power supply circuit 211 and the NFC power supply circuit 333, the switch element 206 is switched off. If the OFF periods of the switch elements 206 and 208 overlap in such switching, power supply noise may occur due to instantaneous interruption of the voltage supplied to the pull-up power supply circuit 211 and the NFC power supply circuit 333. Therefore, the selection control circuit 207 performs control so that, as shown in FIG. 7, the switch element 206 is controlled in the unselected state (OFF state), after the switch element 208 has transitioned from the unselected state (OFF state) to the selected state (ON state) and the output path PT1 of the switching regulator 200 has been selected. That is, by providing an overlap period 701 during which the switch elements 206 and 208 are both in the ON state, instantaneous interruption of the voltage supplied to the pull-up power supply circuit 211 and the NFC power supply circuit 333 is avoided, and generation of power supply noise is prevented.

Figure 4:
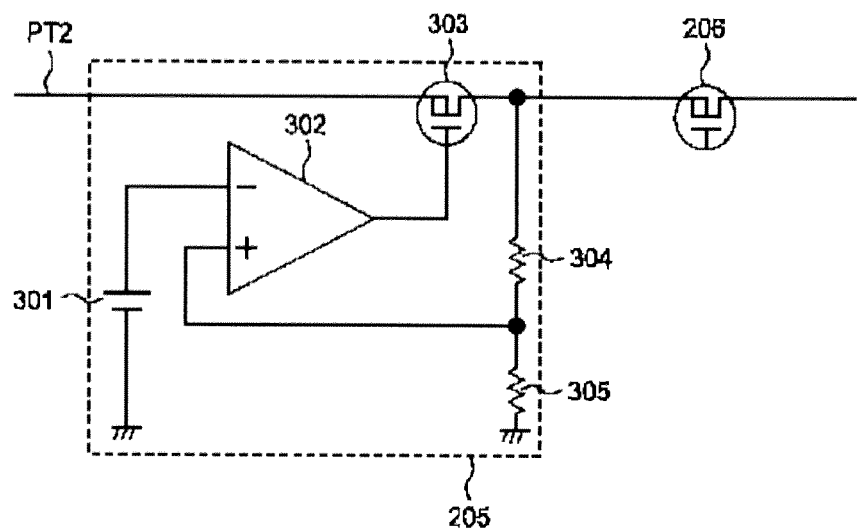
FIG. 4 is an exemplary circuit diagram showing a configuration of a series regulator.

The series regulator 205 in FIG. 2 is arranged between the rectifier circuit 32 and the switch element 206. The series regulator 205 reduces the output voltage of the rectifier circuit 32 to a predetermined level and outputs it, in a shorter time than the time required from when the output voltage of the rectifier circuit 32 is supplied to the switching regulator 200 to when the output voltage of the switching regulator 200 stabilizes. A low-dropout (abbreviated as "LDO") regulator, for example, as shown in FIG. 4 can be applied to the series regulator 205. The LDO regulator shown in FIG. 4 is constituted by including a voltage supply 301, an error amplifier 302, a p-channel MOS transistor 303, and resistors 304 and 305. The p-channel MOS transistor 303 is provided over the bypass path PT2. A voltage at the output of the p-channel MOS transistor 303 is detected by a series coupling circuit of the resistors 304 and 305, the difference between the detection result and the reference voltage of the reference voltage supply 301 is amplified by the error amplifier 302, and the ON resistance value of the p-channel MOS transistor 303 is controlled by the output of the error amplifier 302. With such a control, the p-channel MOS transistor 303 reduces the input voltage of the series regulator 205.

In the NFC power supply circuit 333, two types of output voltages, namely 3.0 V and 1.8 V, can be generated by providing two units of LDO regulators as shown in FIG. 4.

The logic circuit 209 in FIG. 2 includes registers for various controls, and performs various condition settings for the charge control circuit 332 with regard to battery charging, according to input clock signals. The clock signals are generated inside or outside the power supply chip 33C. The logic circuit 209 is coupled to the NFC controller 35 via the serial interface terminal SIF or the input/output terminal IO and exchanges various control information with the NFC controller 35. In addition, the charging status of the battery 34 is transmitted from the charge control circuit 332 to logic circuit 209 by a charging status signal CSS. The logic circuit 209 sets 332 condition information PI with regard to battery charging for the charge control circuit, on the basis of the temperature detection result in the chip, and the output of the ADC210 (terminal voltage information of the battery 34, and temperature information of the battery 34) DO. Battery charging is performed by the charge control circuit 332 according to the setting. The operational power supply voltage of the logic circuit 209 can be generated by a different regulator from the switching regulator 200 and the series regulator 205, on the basis of the voltage which has been input via the power supply input terminal VIN.

When the coil antenna 24 in the power transmitting-side device 2 is approached by a coil antenna in the power receiving-side device 3 in the configuration described above, initial communication (NFC communication) is performed between the power transmitting-side device 2 and the power receiving-side device 3 to exchange information such as whether or not the target of charging is an authenticated device, or information about link status or required power for charging. On the basis of the information exchanged by the initial communication, setting of respective units is performed in the power transmitting-side device 2 and the power receiving-side device 3. According to the NFC communication standard, as shown in FIG. 5, for example, the time from when RF power rises to when the initial communication becomes possible, has to be kept, for example, 5 ms or less.

In the switching regulator 200, the inductor 202 and the capacitor 203 are indispensable to obtain a predetermined direct voltage because switching is performed by the p-channel MOS transistor 401 on the basis of the output of the PWM comparator 405, with the capacitor 203 being charged via the inductor 202, and therefore it takes awhile for the output voltage to stabilize. Accordingly, activation of the NFC communication controller 35 on the basis of the output voltage of the switching regulator 200 makes it difficult to keep the time from when RF power in the power receiving-side device 3 rises to when the initial communication becomes possible, for example, 5 ms or less.

According to configuration shown in FIG. 2, however, when a voltage induced in the coil antenna 36 in the power receiving-side device 3 is rectified by the rectifier circuit 32 and transmitted to the series regulator 205, the voltage is reduced by the series regulator 205 and the output of the series regulator 205 is supplied to the NFC power supply circuit 333 via the switch element 206. The LDO regulator such as that shown in FIG. 4 is neither provided with the inductor 202 nor the capacitor 203, and thus it takes a shorter time to stabilize the output voltage than the switching regulator 200. Therefore, supply of the output of the switching regulator 200 to the NFC power supply circuit 333 and activation of the NFC controller 35 by the output of the NFC power supply circuit 333 on that occasion make it possible to achieve the requirement of keeping the time from when RF power rises to when the initial communication becomes possible, for example, 5 ms or less.

In contrast, since the consumption current is relatively small when the initial communication (NFC communication) is performed in the NFC controller 35, the Joule heat which occurs in the p-channel MOS transistor 303 in the series regulator 205 can be tolerated. However, a case is possible where consumption current becomes large depending on the operation mode other than the initial communication (NFC communication) in the NFC controller 35, in which case the Joule heat which occurs in the p-channel MOS transistor 303 in the series regulator 205 can no longer be tolerated.

According to configuration shown in FIG. 2, therefore, the output of the switching regulator 200 is supplied to the NFC power supply circuit 333 by causing the switch element 208 to select the output path PT1 of the switching regulator 200 after the output voltage of the switching regulator 200 reached a predetermined level. Since starting the supply of the output of the switching regulator 200 to the NFC power supply circuit 333 causes the switch element 206 to be switched off by the selection control circuit 207, the output of the series regulator 205 will no longer be consumed. Since a switching operation is performed in the switching regulator 200, a high efficiency can be obtained with a small power loss, where the amount of heat generation is small in comparison with the LDO regulator.

After the initial communication (NFC communication) has been performed between the power transmitting-side device and the power receiving-side device 3 to exchange information such as whether or not the target of charging is an authenticated device, or information about link status or required power for charging and, on the basis of the information exchanged by the initial communication, setting of respective units has been performed in the power transmitting-side device 2 and the power receiving-side device 3, charging of the battery 34 is started by the control of the charge control circuit 332. The terminal voltage of the battery 34 is monitored by the logic circuit 209 via the ADC210. When the terminal voltage of the battery 34 reaches a predetermined level, wireless battery charging is finished. In addition, battery charging is interrupted if the power receiving-side device 3 moves away from the power transmitting-side device 2 and NFC communication can no longer be normally performed.

<<Second Embodiment>>

Although the series regulator 205 is arranged between the power supply input terminal VIN and the switch element 206 in the first embodiment as shown in FIG. 2, the series regulator 205 may be omitted and the switch element 206 may be coupled to the power supply input terminal VIN. According to such a configuration, omitting the series regulator 205 causes the voltage transmitted from the rectifier circuit 32 to the power supply input terminal VIN to be supplied to the pull-up power supply circuit 211 and the NFC power supply circuit 333 via the switch element 206. The voltage transmitted from the rectifier circuit 32 to the power supply input terminal VIN, being several dozen Volts, is supposed to be supplied to the pull-up power supply circuit 211 and the NFC power supply circuit 333, and thus the load of reducing the voltage in the pull-up power supply circuit 211 and the NFC power supply circuit 333 grows larger. However, the circuit size of the voltage step-down circuit 331 is reduced in comparison with the case shown in FIG. 2 by omitting the series regulator 205.

Although the present invention has been specifically described above on the basis of embodiments, it is needless to say that the invention is not limited to the embodiments and can be modified in various ways in a range not deviating from its concept.

For example, the power supply unit 33 and the NFC controller 35 may be formed in a single IC.

What is claimed is:

1. A wireless communication device comprising:
   a communication control circuit configured to transmit and receive control information;
   a power control circuit including a first regulator circuit, a second regulator circuit and a selection circuit,
   the power control circuit being configured to receive a source voltage, supply a power supply voltage to the communication control circuit and output a charging voltage to a battery,
   the first regulator circuit being configured to input the source voltage and output a first voltage to the selection circuit;
   the second regulator circuit being configured to input the source voltage and output a second voltage to the selection circuit;
   wherein the selection circuit is configured to select and output the first voltage as the power supply voltage when a level of the first voltage reaches a predetermined level, and to select and output the second voltage as the power supply voltage when the level of the first voltage has not reached the predetermined level,
   wherein an activation time of the second regulator is faster than that of the first regulator,
   wherein the first regulator circuit includes a switching regulator, and
   wherein the second regulator circuit includes a series regulator.

2. A wireless communication device according to claim 1, a power consumption of the first regulator is smaller than that of the second regulator.

3. A wireless communication device according to claim 1, wherein the selection circuit further includes a comparator circuit and a selection circuit,
   wherein the comparator circuit is configured to compare the first voltage with a reference voltage and output a result voltage to the selection control circuit,
   wherein the selection control circuit is configured to select the power supply voltage from the first voltage and the second voltage based on the result voltage.

4. A wireless communication device according to claim 3, wherein the control information includes a state of wireless communication.

5. A wireless communication device according to claim 1, further comprising:
   a coil antenna;
   a rectifier circuit configured to couple with the coil antenna, the rectifier circuit being configured to rectify an alternating-current signal obtained via the coil antenna and output the source voltage to the power control circuit.

* * * * *